(12) United States Patent
Grede et al.

(10) Patent No.: US 10,490,876 B2
(45) Date of Patent: Nov. 26, 2019

(54) DIRECTIONAL COUPLERS AND METHODS FOR TUNING DIRECTIONAL COUPLERS

(71) Applicant: TRUMPF Huettinger GmbH + Co. KG, Freiburg (DE)

(72) Inventors: Andre Grede, Freiburg (DE); Daniel Gruner, Muellheim (DE); Alexander Alt, Freiburg (DE); Nikolai Schwerg, Genève (CH); Christian Wangler, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 48 days.

(21) Appl. No.: 15/852,883

(22) Filed: Dec. 22, 2017

(65) Prior Publication Data
US 2018/0123216 A1   May 3, 2018

Related U.S. Application Data

(63) Continuation of application No. PCT/EP2016/065378, filed on Jun. 30, 2016.

(30) Foreign Application Priority Data

Jun. 30, 2015   (DE) .................. 10 2015 212 184

(51) Int. Cl.
*H01P 5/18*   (2006.01)
*H05K 1/02*   (2006.01)
*H01P 3/08*   (2006.01)

(52) U.S. Cl.
CPC .............. *H01P 5/184* (2013.01); *H01P 5/185* (2013.01); *H05K 1/0237* (2013.01); *H05K 2201/09227* (2013.01)

(58) Field of Classification Search
CPC .. H01P 5/18; H01P 5/184; H01P 5/185; H01P 3/08
(Continued)

(56) References Cited

U.S. PATENT DOCUMENTS 3,581,243 A * 5/1971 Alford .................... H01P 5/185
                                                                    333/116
5,424,694 A * 6/1995 Maloratsky ............. H01P 5/185
                                                                    333/112
(Continued)

FOREIGN PATENT DOCUMENTS

| DE | 102007029125 | 1/2009 |
| DE | 102012205243 | 10/2013 |
| WO | WO 2017/001596 | 1/2017 |

OTHER PUBLICATIONS

International Search Report and Written Opinion in International Application No. PCT/EP2016/065378, dated Oct. 7, 2016, 25 pages (with English translation).

*Primary Examiner* — Dean O Takaoka
(74) *Attorney, Agent, or Firm* — Fish & Richardson P.C.

(57) ABSTRACT

This disclosure relates to directional couplers and methods of tuning directional couplers formed in a printed circuit board. The directional couplers include a main line for transmitting power and at least one secondary line having a coupling portion arranged parallel and at a distance from the main line in a coupling region. The directional coupler includes one or more additional coupling lines that have a coupling portion that runs parallel to and at a distance from the coupling section of the at least one secondary line. The one or more additional coupling lines have a connection arranged on the outer portion of the printed circuit board for selective grounding or connection to an external connection.

23 Claims, 2 Drawing Sheets

(58) Field of Classification Search
USPC .......................................... 333/109–112, 116
See application file for complete search history.

(56) References Cited

U.S. PATENT DOCUMENTS

| | | | | |
|---|---|---|---|---|
| 5,689,217 | A * | 11/1997 | Gu | H01P 5/187 |
| | | | | 333/116 |
| 5,884,149 | A * | 3/1999 | Jaakola | H03G 3/3042 |
| | | | | 455/103 |
| 5,907,266 | A | 5/1999 | Budka et al. | |
| 6,104,240 | A | 8/2000 | Fujimoto et al. | |
| 7,042,309 | B2 * | 5/2006 | Podell | H01P 5/187 |
| | | | | 333/112 |
| 7,323,955 | B2 * | 1/2008 | Jachowski | H01P 1/2039 |
| | | | | 327/556 |
| 8,258,889 | B2 | 9/2012 | Fluhrer | |
| 8,643,447 | B2 * | 2/2014 | Chen | H01P 5/187 |
| | | | | 333/109 |
| 2005/0017821 | A1 | 1/2005 | Sawicki | |
| 2005/0146394 | A1 | 7/2005 | Podell | |
| 2008/0036554 | A1 | 2/2008 | Krausse et al. | |
| 2010/0026415 | A1 | 2/2010 | Mann et al. | |
| 2011/0148544 | A1 | 6/2011 | Hirai et al. | |
| 2011/0273242 | A1 * | 11/2011 | Totani | H01P 5/185 |
| | | | | 333/116 |
| 2012/0319797 | A1 * | 12/2012 | Tamaru | H01P 5/184 |
| | | | | 333/112 |
| 2015/0236666 | A1 * | 8/2015 | Ootsuka | H01P 5/185 |
| | | | | 333/109 |

* cited by examiner

DIRECTIONAL COUPLERS AND METHODS FOR TUNING DIRECTIONAL COUPLERS

CROSS REFERENCE TO RELATED APPLICATIONS

This application is a continuation of and claims priority under 35 U.S.C. § 120 from PCT Application No. PCT/EP2016/065378 filed on Jun. 30, 2016, which claims priority from German Application No. DE 10 2015 212 184.4, filed on Jun. 30, 2015. The entire contents of each of these priority applications are incorporated herein by reference.

TECHNICAL FIELD

The invention relates to directional couplers and to methods for tuning directional couplers.

BACKGROUND

High-frequency generators are used to generate high-frequency power and to supply the high-frequency power to a load. Possible loads are, for example, plasma processes, such as plasma coating and plasma etching, or laser processes (laser excitation). Since the impedance of the load may change, and mismatching may thus lead to (partial) reflection of the power supplied by the high-frequency generator, it is often the case that not all of the power supplied by the high-frequency generator is absorbed in the load (e.g., the plasma). Determining the power absorbed by the load permits precise adjustments in the control of the high-frequency power supplied to the load.

A directional coupler may be used for measuring and/or determining the high-frequency power absorbed in a load. US Patent Publication 2005/0017821 A1, for example, discloses a directional coupler. The absorbed high-frequency power is derived from the difference between the power generated by the high-frequency generator and the reflected power. As a result, it is possible to control the high-frequency generator in such a way that the power absorbed in the load can be very precisely adjusted and can be kept constant.

A directional coupler including a main line via which high-frequency power is transmitted in the direction of the load and two secondary lines can be used to detect both the high-frequency power supplied in the direction of the load and the reflected power. In this case, the power supplied in the direction of the load can be measured by one secondary line and the reflected power can be measured by the other secondary line. As a result of the high-frequency power being supplied via the main line, electromagnetic fields occur that are coupled to the secondary lines such that a measurement signal can be detected at the secondary lines, which measurement signal is related to the power on the main line.

The quality of the measurement is described using the term "directivity". The aim is to detect, on one secondary line, as far as possible, only portions of the power supplied in the direction of the load, and, by means of the other secondary line, as far as possible, only portions of the reflected power. In practice, however, this is not fully achieved. This means that the secondary line, by means of which only the power supplied in the direction of the load is intended to be detected, detects a small portion of the reflected power. The directivity refers to the relationship between the power detection of the desired signal and the power detection of the undesired signal. The directivity should be as great as possible.

Directional couplers are frequently implemented on circuit boards. However, directional couplers of this type are subject to manufacturing variations, the effects of which do not become apparent until after production when the function is being checked. If, in the case of directional couplers for multi-layered circuit boards, the coupling structure is on an inner layer, the geometry of the coupler structure cannot be adapted retrospectively, e.g. by means of laser trimming. Therefore, the tolerances have to be accepted, which leads to a lower measurement dynamic.

SUMMARY

The present disclosure relates to directional couplers configured in such a way that the effects of manufacturing tolerances can be counteracted or can be compensated.

In one aspect, the present disclosure provides directional couplers formed at least in part in a circuit board. The directional couplers include a main line for transferring power and at least one secondary line that is arranged in the circuit board so as to have a primary coupling portion that is parallel with and at a distance from the main line. The primary coupling portion defines a coupling region wherein the primary coupling portion is configured to be electromagnetically coupled to the main line via an electromagnetic field generated during transmission of power via the main line. The directional coupler also includes "m" first additional coupling lines (where m≥1), which comprise a secondary coupling portion that extends in parallel with and at a distance from the primary coupling portion of the at least one secondary line. The first additional coupling line(s) include a terminal that is arranged on a peripheral edge of the circuit board for selectively connecting to earth or ground or to external wiring.

In certain implementations, the circuit board includes a multi-layered circuit board. In certain implementations, the first additional coupling lines are connected to ground. In this way, the electromagnetic coupling between the main line and the primary coupling portion can be weakened. In particular, positive thickness tolerances, for example, of the circuit board material can be compensated for in this manner. Both the coupling and the decoupling can be influenced by the additional coupling lines. As a result, the required adjustment range of subsequent sump wiring can be reduced to maximize the isolation of the directional coupler. Certain disadvantages of the prior art, which lead to reduced measurement dynamics, can be prevented. In particular, the measurement dynamics of the entire measurement system can be improved by means of the measures according to particular embodiments of the invention. In the case of directional couplers, the tolerance-dependent leakage is improved.

In certain implementations, additional coupling lines are employed to either weaken or amplify the measurement signal to compensate for the effects of manufacturing tolerances.

The coupling portion of the first additional coupling lines may be shorter than the coupling portion of the at least one secondary line. In particular implementations, a plurality of coupling portions of the first additional coupling lines may be provided in the longitudinal direction of the coupling portion of the at least one secondary line. For example, two first additional coupling lines may be provided, the length of the coupling portions of the first additional coupling lines can correspond to approximately half the length of the coupling portion of the at least one secondary line, in accordance with certain implementations.

The coupling portions of the first additional coupling lines may be at a distance of <2 mm, and/or a distance of <1 mm, from the coupling portion of the at least one secondary line. The small distance from the coupling portion of the at least one secondary line makes it possible to ensure that the coupling portions of the additional coupling lines are also effective.

The coupling portions of the first additional coupling lines may be arranged on a side of the coupling portion of the at least one secondary line, which side is facing away from the main line. The coupling portions thus influence, in a controlled manner, the interaction between the main line and the at least one secondary line.

The coupling portions of the first additional coupling line may be a smaller distance away from the coupling portion of the at least one secondary line than the coupling portion of the at least one secondary line is from the main line. In this manner, fine-tuning of the directional coupler can be carried out particularly effectively.

In certain implementation, "n" second additional coupling lines (where n≥1) are provided, which comprise a coupling portion that extends in parallel with and at a distance from the main line and which are electrically connected in parallel with the at least one secondary line. The coupling can be strengthened as a result. Too weak a coupling, e.g. owing to negative thickness tolerances of the circuit board material, can be compensated as a result.

By appropriately selecting the number "n" and "m" and the wiring of the additional coupling lines, the coupling can be adjusted so finely that the change to the coupling on account of manufacturing tolerances is minimal.

The coupling portions of the second additional coupling lines may be arranged outside the coupling region. In particular, the coupling portions of the second additional coupling lines may be arranged in front of and/or behind the coupling portion of the secondary line, when viewed in the longitudinal direction of the coupling portion of the at least one secondary line.

To ensure that the signal in question is coupled out mainly by the at least one secondary line, the coupling portions of the second additional coupling lines may be shorter than the coupling portion of the at least one secondary line.

The coupling portions of the first additional coupling lines may be arranged in the same layer. The coupling portions of the second additional coupling lines may also be arranged in the same layer. In particular implementations, the coupling portions of the first and second additional coupling lines may be arranged in the same or in different layers.

In certain implementations, the coupling portions of all the lines are arranged in the same layer. A directional coupler designed in this way can be produced particularly simply, since all the lines or the coupling portions thereof can be produced in one or the same circuit board processing step.

The at least one secondary line and the additional coupling lines may be formed as conductive tracks, the coupling portions of the additional coupling lines being narrower than the coupling portion of the at least one secondary line. The properties of the directional coupler can be influenced by appropriately selecting the widths of the coupling portions.

The coupling portions of the additional coupling lines may be arranged in a different layer from the coupling portion of the at least one secondary line. Additional adjustment options arise as a result.

The directional coupler may be constructed symmetrically with respect to a central plane of the main line. In particular implementations, secondary lines and respectively associated additional coupling lines may be provided on either side of the main line.

In another aspect, the present disclosure provides methods for tuning a directional coupler formed at least in part in a circuit board. The method includes transmitting power via a main line positioned in the circuit board. A primary coupling portion of at least one secondary line is electromagnetically coupled with the main line via an electromagnetic field during the transmission of power via the main line. The primary coupling portion is parallel with the main line and spaced apart a distance from the main line. The method includes grounding a secondary coupling portion of one or more additional coupling lines positioned in the circuit board in the coupling region via a terminal of the one or more additional coupling lines. The terminal is arranged on a peripheral edge of the multi-layered circuit board. The secondary coupling portion extends in parallel with the primary coupling portion and is spaced apart from the primary coupling portion.

In certain implementations, the methods include connecting at least one second additional coupling line in parallel with the at least one secondary line. The at least one second additional coupling line comprises a tertiary coupling portion that extends in parallel with the main line and is spaced apart from the main line. The at least one second additional coupling line can be connected in parallel with the at least one secondary line to compensate for manufacturing tolerances by changing to the electromagnetic coupling between the primary coupling portion and the secondary line.

Additional features and advantages of the invention can be found in the following detailed description of embodiments of the invention, with reference to the drawings, which show details essential to the invention, and in the claims. The features disclosed therein should not necessarily be considered as being to scale and are shown such that the particularities according to the invention are clearly visible. The various features may each be implemented in isolation or together in any desired combination in variants of the invention.

Embodiments of the invention are shown in the schematic drawings and are explained in more detail in the subsequent description.

DETAILED DESCRIPTION

Figure 1:
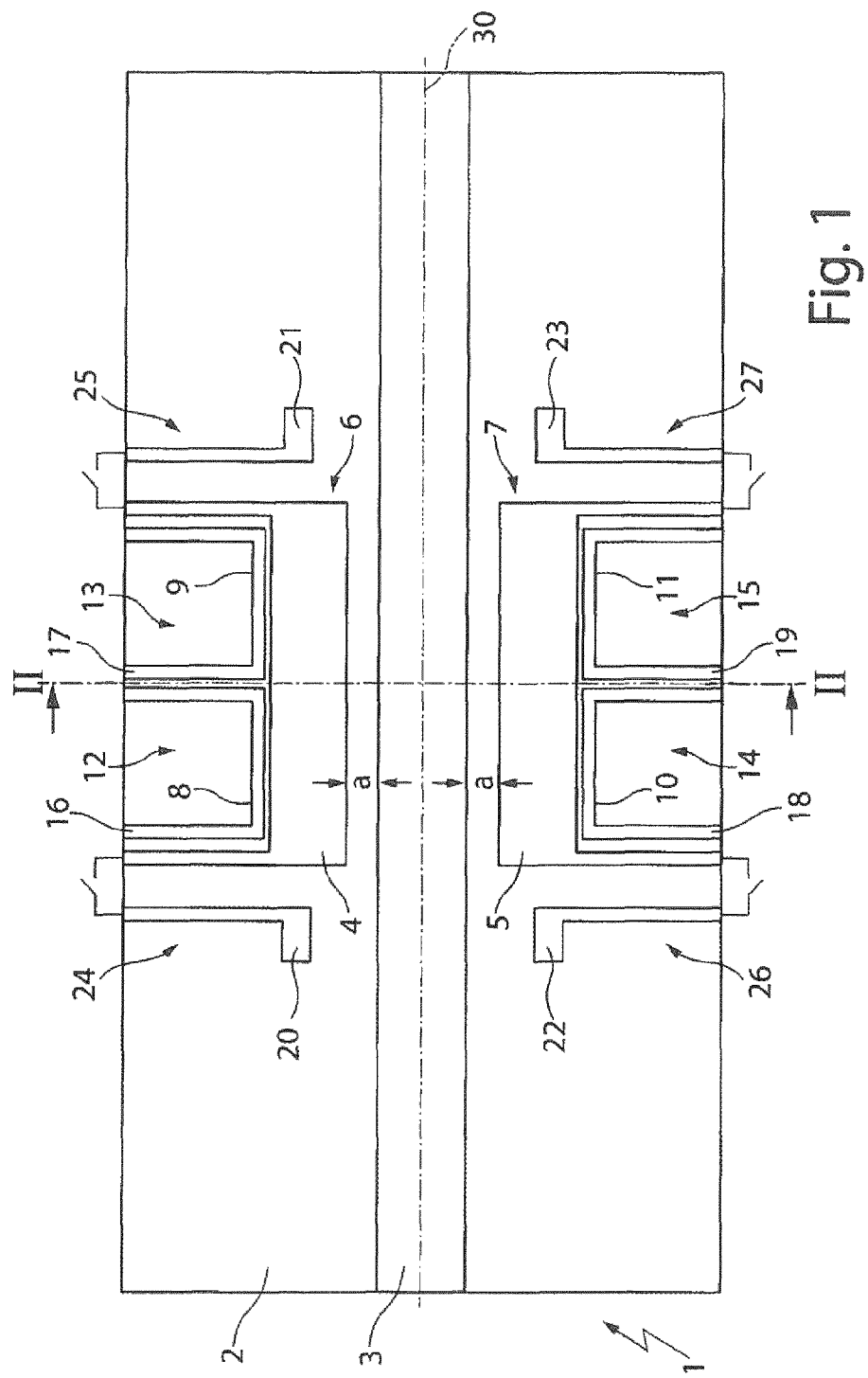
FIG. 1 is a plan view of a layer of a directional coupler.

FIG. 1 is a plan view of a layer of a directional coupler 1. The directional coupler 1 consists of a multi-layered circuit board material 2, a main line 3 being arranged within the directional coupler 1. The main line 3 is intended for transmitting electrical power (e.g. a metal or copper line), for example from left to right in the embodiment shown, from a high-frequency power generator to a load, or from right to left if the power of a load is reflected. Coupling portions 4, 5 of secondary lines 6, 7 extend in parallel with the main line 3. The coupling portions 4, 5 are spaced a distance "a" from the main line 3. The length of the coupling portions 4, 5 defines a coupling region. In a completed directional coupler 1, the main line 3, and the secondary lines 6, 7 are generally covered by additional circuit board material, such that they are located inside the directional coupler 1. The coupling structure, which comprises the main line 3 and the secondary lines 6, 7, is not accessible from the outside when the main line 3 and the secondary lines 6, 7 are covered by additional circuit board material.

A different material from the rest of the circuit board material, for example a prepreg reinforcing fabric, for example Arlon TC350™ or Rogers RO4350B™, may be provided between the main line 3 and the coupling portions 4, 5 of the secondary lines 6, 7. Coupling portions 8-11 of first additional coupling lines 12-15 extend at a small distance from and in parallel with the coupling portions 4, 5 of the secondary lines 6, 7. The coupling portions 8-11 are arranged on the side of the coupling portions 4, 5 remote from the main line 3. The first additional coupling lines 12-15 comprise terminals 16-19 on the outside or a peripheral edge of the circuit board 2, which terminals are provided for connection to ground or to external wiring. Connecting one or more of the terminals 16-19 to ground means that the coupling of the directional coupler 1 can be adjusted or manufacturing tolerances can be corrected. The length of the coupling portion 8-11 corresponds to approximately half the length of the coupling portions 4, 5.

FIG. 1 also shows coupling portions 20-23 of second additional coupling lines 24-27 that can be electrically connected in parallel with the secondary lines 4, 5; this is indicated by the switches 40-43 shown in the drawing. In this case, the coupling portions 20-23 are arranged so as to be at a distance from the main line 3. The coupling portions 20-23 are in particular arranged at a further distance from the main line 3 than the coupling portions 4, 5. It can also be seen that the coupling portions 20-23 are outside the coupling region defined by the length of the coupling portions 4, 5. In particular, the coupling portions 20-23 are arranged in front of and behind the coupling portions 4, 5, when viewed in the extension direction of coupling portions 4, 5.

All of the coupling portions of the additional coupling lines have a smaller width than the coupling portions 4, 5 of the secondary lines 6, 7. All of the coupling portions are narrower than the main line 3. It can also be seen that the directional coupler 1 is symmetrical with respect to a central plane 30.

Figure 2:
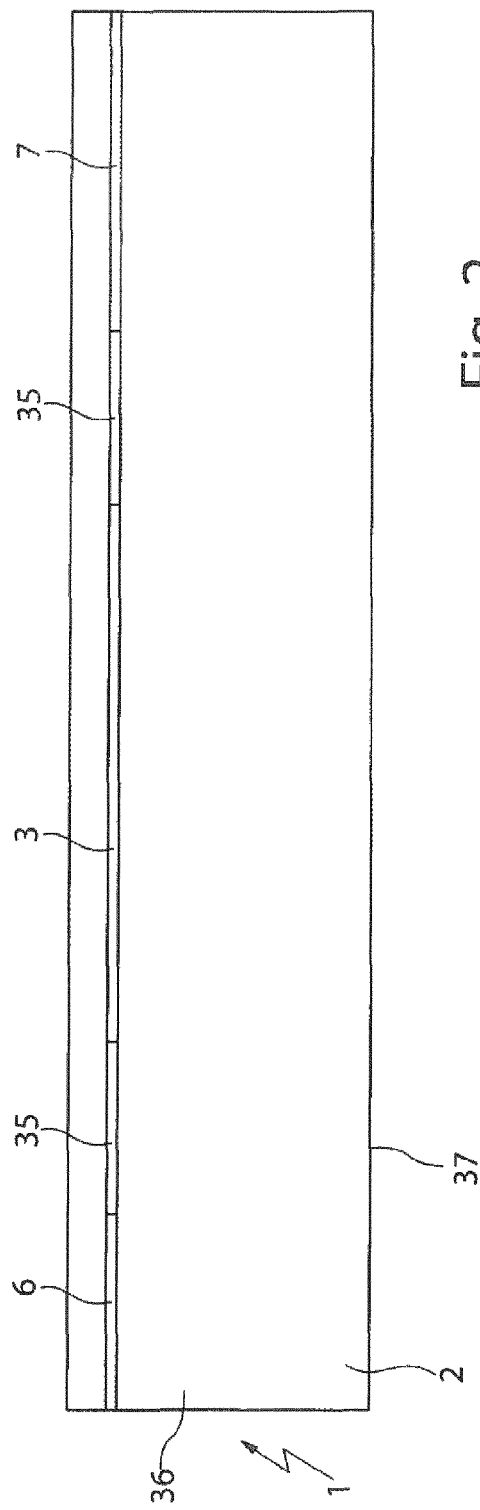
FIG. 2 is a sectional view through a directional coupler.

FIG. 2 is a sectional view through the directional coupler 1 along the line II-II in FIG. 1, where no additional coupling lines are visible here. The secondary lines 6, 7 are arranged next to the main line 3. A material 35, which is different from the material 36 of the rest of the circuit board 2, is located between the main line 3 and the secondary lines 6, 7; in particular embodiments, the material 35 is prepreg. By appropriately selecting the material 35, the coupling of the directional coupler 1 can also be influenced. The material 35 acts like a dielectric. The material 35 influences the electromagnetic coupling, for example improving the electromagnetic coupling to make the directional coupler more sensitive to signal changes, and different coupling can be achieved by using materials having different dielectric constants.

In certain embodiments, the entire structure of the directional coupler 1 is housed or enclosed inside of a component such as a circuit board and is thus no longer accessible from outside of the component once the directional coupler 1 has been manufactured. On the underside, the circuit board 2 comprises a metal plate, in particular a copper layer. This metal plate is in particular a grounding layer. The heat that results from the power dissipation can be conducted away by the metal plate towards a cooling plate located therebelow.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:

1. A method for tuning a directional coupler formed at least in part in or on a multi-layered circuit board, the method comprising: transmitting power via a main line positioned in the multi-layered circuit board whereby a primary coupling portion of at least two secondary lines are electromagnetically coupled with the main line via an electromagnetic field, wherein the primary coupling portion is parallel with and spaced apart a distance from the main line; and selectively grounding a secondary coupling portion with one or more additional coupling lines positioned in the multi-layered circuit board in the coupling region via terminal of the one or more additional coupling lines positioned on one or more outside edges of the multi-layered circuit board to vary coupling of the directional coupler, wherein the secondary coupling portions extend parallel with and are spaced apart from the primary coupling portion.

2. The method of claim 1, further comprising:
   connecting at least one second additional coupling line in parallel with the at least one secondary line, wherein the at least one second additional coupling line comprises a tertiary coupling portion that extends in parallel with and is spaced apart from the main line such that a change to the electromagnetic coupling between the primary coupling portion and the secondary line on account of manufacturing tolerances is compensated.

3. A directional coupler formed at least in part in or on a multilayered circuit board, the directional coupler comprising:
   a main line positioned in the multilayered circuit board for transmitting power;
   at least two secondary lines positioned in the multilayered circuit board so as to each have a primary coupling portion that is parallel with and spaced apart from the main line, wherein the primary coupling portion of each of the at least two secondary lines defines a respective coupling region, wherein in the respective coupling regions the main line and the at least two secondary lines are positioned inside of the multilayered circuit board, wherein the primary coupling portion of each of the at least two secondary lines is configured to be electromagnetically coupled to the main line via an electromagnetic field generated during transmission of power via the main line; and
   wherein each of the at least two secondary lines comprises one or more additional coupling lines positioned in the multilayered circuit board and configured to be selectively coupled in parallel with a respective one of the at least two secondary lines, wherein the one or more additional coupling lines comprise a secondary coupling portion that extends parallel with and is spaced apart from the primary coupling portion, wherein the one or more additional coupling lines comprise a terminal that is arranged on an outside edge of the multilayered circuit board for selective grounding of the one or more additional coupling lines, whereby grounding of the one or more additional coupling lines adjusts a strength of electromagnetic coupling between the primary coupling portion and the main line of the directional coupler to adjust power transmitted or for manufacturing tolerances to be corrected.

4. The directional coupler of claim 3, wherein circuit board material of the multilayered circuit board covers the coupling region of the main line and the at least two secondary lines.

5. The directional coupler of claim 3, further comprising at least one switch for each one of the at least two secondary lines, the at least one switch configured to connect the terminal that is arranged on the outside edge of the multilayered circuit board with a respective one of the at least two second lines, whereby the one or more additional coupling lines are selectively coupled in parallel with the respective one of the at least two secondary lines.

6. The directional coupler of claim 3, wherein the secondary coupling portion of the one or more additional coupling lines is shorter than the primary coupling portion of the at least two secondary lines.

7. The directional coupler of claim 3, wherein the one or more additional coupling lines comprise a plurality of coupling lines provided in the longitudinal direction of the coupling portion and each comprising a secondary coupling portion.

8. The directional coupler of claim 3, wherein the secondary coupling portion of the one or more additional coupling lines is at a distance of less than 2 mm from the primary coupling portion of the at least one secondary line.

9. The directional coupler of claim 3, wherein the secondary coupling portion of the one or more additional coupling lines is at a distance of less than 1 mm from the primary coupling portion of the at least one secondary line.

10. The directional coupler of claim 3, wherein the secondary coupling portion of the one or more additional coupling lines is arranged on a side of the primary coupling portion of the at least one secondary line that is facing away from the main line.

11. The directional coupler of claim 3, wherein the secondary coupling portion of the one or more additional coupling line is at a smaller distance from the primary coupling portion of the at least one secondary line than the primary coupling portion of the at least one secondary line is from the main line.

12. The directional coupler of claim 3, further comprising at least one second additional coupling line comprising a tertiary coupling portion that extends in parallel with and at a distance from the main line and that is electrically connected in parallel with the at least one secondary line.

13. The directional coupler of claim 12, wherein the tertiary coupling portion of the at least one second additional coupling line is arranged outside of the coupling region.

14. The directional coupler of claim 12, wherein the tertiary coupling portion of the at least one second additional coupling line is arranged in front of and/or behind the primary coupling portion of the secondary line, when viewed in a longitudinal direction of the coupling portion of the at least one secondary line.

15. The directional coupler of claim 12, wherein the tertiary coupling portion of the at least one second additional coupling line is shorter than the primary coupling portion of the at least one secondary line.

16. The directional coupler of claim 3, wherein the secondary coupling portion of the one or more additional coupling lines is arranged in the same layer of the multi-layered circuit board.

17. The directional coupler of claim 12, wherein the tertiary coupling portion of the at least one second additional coupling line is arranged in the same layer of the multi-layered circuit board.

18. The directional coupler of claim 3, further comprising at least one second additional coupling line comprising a tertiary coupling portion that extends in parallel with and at a distance from the main line, wherein the secondary coupling portion and the tertiary coupling portion are arranged in different layers of the multi-layered circuit board.

19. The directional coupler of claim 3, further comprising at least one second additional coupling line comprising a tertiary coupling portion that extends in parallel with and at a distance from the main line, wherein the secondary coupling portion and the tertiary coupling portion are arranged in the same layer of the multi-layered circuit board.

20. The directional coupler of claim 3, wherein the primary coupling portion, the secondary coupling portion, and the tertiary coupling portion are arranged in the same layer of the multi-layered circuit board.

21. The directional coupler of claim 3, wherein the at least one secondary line and the one or more additional coupling lines are in the form of conductor tracks, and wherein the secondary coupling portion and the tertiary coupling portion are narrower than the primary coupling portion of the at least one secondary line.

22. The directional coupler of claim 3, wherein the secondary coupling portion and the tertiary coupling portion are arranged in a different layer from the primary coupling portion of the at least one secondary line.

23. The directional coupler of claim 3, wherein the directional coupler is constructed symmetrically with respect to a central plane of the main line.

* * * * *